(12) United States Patent
Gliese et al.

(10) Patent No.: US 7,279,936 B2
(45) Date of Patent: Oct. 9, 2007

(54) LOGIC BASIC CELL, LOGIC BASIC CELL ARRANGEMENT AND LOGIC DEVICE

(75) Inventors: Jörg Gliese, Munich (DE); Tim Schönauer, Munich (DE)

(73) Assignee: Infineon Technologies AG (DE)

( * ) Notice: Subject to any disclaimer, the term of this patent is extended or adjusted under 35 U.S.C. 154(b) by 150 days.

(21) Appl. No.: 11/007,650

(22) Filed: Dec. 7, 2004

(65) Prior Publication Data
US 2005/0253625 A1 Nov. 17, 2005

(30) Foreign Application Priority Data
Dec. 8, 2003 (DE) ............... 103 57 209
Mar. 9, 2004 (DE) ............ 10 2004 011 487

(51) Int. Cl.
*H03K 19/20* (2006.01)
*H03K 19/084* (2006.01)
*H03K 19/21* (2006.01)
*G11C 8/00* (2006.01)
*G06F 7/50* (2006.01)

(52) U.S. Cl. .............. 326/104; 326/105; 326/108; 326/113; 326/114; 326/52; 326/55

(58) Field of Classification Search .......... 326/104, 326/105, 108, 113, 114, 95, 98, 37–41, 47
See application file for complete search history.

(56) References Cited

U.S. PATENT DOCUMENTS

| | | | | |
|---|---|---|---|---|
| 4,006,365 A | * | 2/1977 | Marzin et al. ............. | 326/55 |
| 4,749,886 A | * | 6/1988 | Hedayati .................. | 326/55 |
| 5,568,067 A | * | 10/1996 | McDermott et al. ........ | 326/55 |
| 5,923,189 A | * | 7/1999 | Sasaki et al. ............. | 326/113 |
| 6,285,218 B1 | | 9/2001 | Dhong et al. | |
| 6,529,040 B1 | | 3/2003 | Carberry et al. | |
| 6,829,750 B2 | * | 12/2004 | Maki et al. ............... | 716/3 |
| 2005/0134317 A1 | * | 6/2005 | Gliese et al. ............. | 326/98 |
| 2005/0140389 A1 | * | 6/2005 | Gliese et al. ............. | 326/41 |
| 2005/0225359 A1 | * | 10/2005 | Campbell .................. | 326/105 |
| 2005/0285622 A1 | * | 12/2005 | Gliese .................... | 326/37 |
| 2006/0195503 A1 | * | 8/2006 | Swami et al. ............. | 708/620 |

OTHER PUBLICATIONS

Wannemacher, M.; "Das FPGA-Kochbuch", Abb. 6.4: SRAM-Zelle von XILINX, 1. Auflage, International Thomson Publishing Company, Bonn, 1998, p. 111, no month.
Wannemacher, M.; "Das FPGA-Kochbuch", Abb.7.36: Logikblock (CLB) der XC4000-Familien, 1. Auflage, International Thomson Publishing Company, Bonn, 1998, p. 197, no month.

* cited by examiner

*Primary Examiner*—Vibol Tan
*Assistant Examiner*—Dylan White
(74) *Attorney, Agent, or Firm*—Dickstein, Shapiro, LLP.

(57) ABSTRACT

A logic basic cell, a logic basic cell arrangement, and a logic device. A logic basic cell is provided for forming a logic combination of two data signals in accordance with a logic function that can be selected by means of a plurality of logic selection elements, having four data signal inputs, to which two data signals and the logically complementary data signals thereof can be applied, and having six logic selection elements between the data signal inputs. At a data signal output, the logic combination of the two data signals in accordance with the logic function selected by means of the logic selection elements can be provided as output signal.

32 Claims, 9 Drawing Sheets

FIG 2

| $s_0p$ | $s_1p$ | $s_2p$ | $s_3p$ | $s_4p$ | $s_5p$ | $s_0n$ | $s_1n$ | $s_2n$ | $s_3n$ | $s_4n$ | $s_5n$ | y |
|---|---|---|---|---|---|---|---|---|---|---|---|---|
| 0 | 0 | 0 | 0 | 0 | 0 | 0 | 0 | 0 | 0 | 0 | 0 | 1 |
| 1 | 1 | 0 | 1 | 1 | 0 | 1 | 0 | 0 | 0 | 0 | 0 | $a_0$ or $a_1$ |
| 0 | 1 | 1 | 1 | 1 | 0 | 0 | 1 | 0 | 0 | 1 | not ($a_0$ or $a_1$) |
| 1 | 1 | 1 | 0 | 0 | 1 | 0 | 1 | 0 | 0 | 0 | 0 | $a_0$ or not ($a_1$) |
| 1 | 0 | 1 | 1 | 1 | 1 | 0 | 0 | 0 | 1 | 1 | 0 | not ($a_0$) and $a_1$ |
| 1 | 1 | 0 | 0 | 1 | 1 | 1 | 1 | 0 | 0 | 0 | 0 | $a_0$ |
| 0 | 0 | 1 | 1 | 1 | 1 | 0 | 0 | 1 | 1 | 0 | 0 | not $a_0$ |
| 0 | 1 | 1 | 1 | 1 | 0 | 0 | 0 | 1 | 0 | 0 | 0 | not ($a_0$) or $a_1$ |
| 1 | 1 | 0 | 1 | 1 | 1 | 1 | 0 | 0 | 0 | 0 | 1 | $a_0$ and not ($a_1$) |
| 1 | 1 | 1 | 1 | 1 | 0 | 0 | 0 | 0 | 0 | 1 | 0 | $a_1$ |
| 1 | 1 | 1 | 1 | 0 | 1 | 0 | 0 | 0 | 0 | 0 | 1 | not ($a_1$) |
| 0 | 1 | 1 | 0 | 1 | 1 | 0 | 1 | 1 | 0 | 0 | 0 | $a_0$ xnor $a_1$ |
| 1 | 0 | 0 | 1 | 1 | 1 | 1 | 0 | 0 | 1 | 0 | 0 | $a_0$ xor $a_1$ |
| 1 | 1 | 1 | 0 | 1 | 1 | 0 | 1 | 0 | 0 | 1 | 0 | $a_0$ and $a_1$ |
| 1 | 0 | 1 | 1 | 0 | 1 | 0 | 0 | 0 | 1 | 0 | 0 | $a_0$ nand $a_1$ |
| 1 | 1 | 1 | 1 | 1 | 1 | 1 | 1 | 1 | 1 | 1 | 1 | 0 |

200

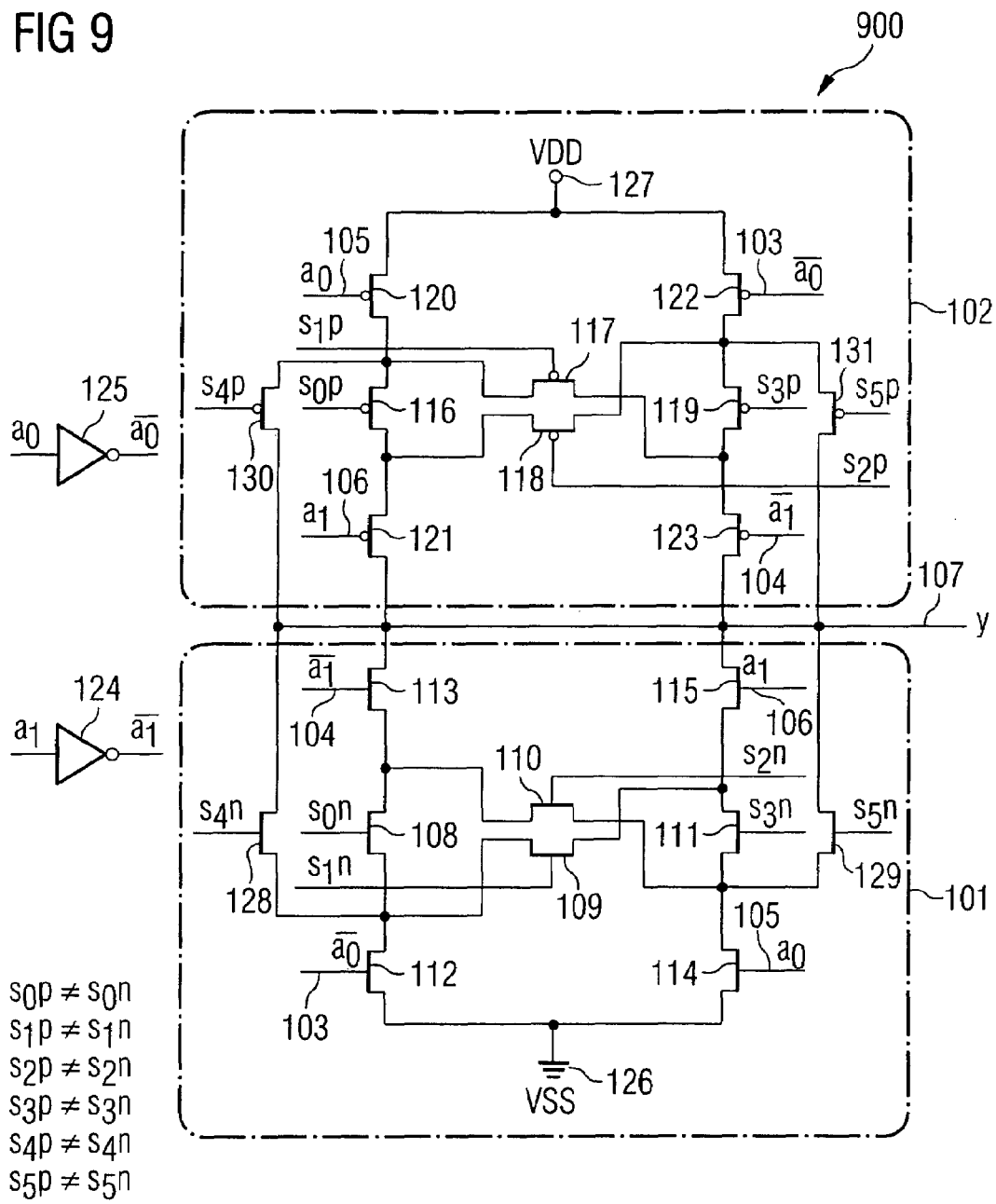

US 7,279,936 B2

LOGIC BASIC CELL, LOGIC BASIC CELL ARRANGEMENT AND LOGIC DEVICE

CROSS-REFERENCE TO RELATED APPLICATION

This application claims priority to German Patent Application Serial No. 103 57 209.0, filed Dec. 8, 2003, and to German Patent Application Serial No. 10 2004 011 487.0, filed Mar. 9, 2004.

FIELD OF THE INVENTION

The invention relates to a logic basic cell, a logic cell arrangement and a logic device.

BACKGROUND OF THE INVENTION

The advent of digital technology and the rapid development of microprocessor technology gave rise to a demand for programmable logic. A PLD ("programmable logical device") is an integrated circuit whose logic function is defined by the user by means of programming. A PLD is an architecture for digital logic operations with a plurality of switches that enable a multiplicity of signal paths. The logic function assigned to a PLD in a user-specific fashion is defined by means of the configuration of the PLD.

PLDs include, inter alia, field-programmable gate arrays (FPGAs), the functionality of which can be assigned to them by the user, mask-programmable gate arrays (MPGAs, also called "structured ASICs"), which can be allocated a logic function by means of hardware configuration. Via-programmable gate arrays (VPGAs) belong among MPGAs.

A digital logic cell maps n input signals onto an output signal. The number of possible mapping functions is $2^{2^n}$. A circuit group as a digital logic cell is realized in accordance with the prior art by using so-called look-up tables (LUT), for example. For this purpose, function values of the logic function are set by means of a data word of $2^n$ bits. In other words, the respectively selected logic function is coded into a data word. n input signals $a_0, a_1, \ldots a_{n-1}$ are combined with one another in accordance with the selected logic function. Consequently, the logic input signals of the logic function $y=f(a_0, a_1, \ldots, a_{n-1})$ may be regarded as a binary address and converted into a one-hot coding in order to select the function value subsequently by means of pass gate logic. Such a method is disclosed in Wannemacher, M "Das FPGA Kochbuch", ["The FPGA Cookbook"], FIG. 6.4: SRAM cell from XILINX, 1st Edition, International Thomson Publishing Company, Bonn, 1998, p. 111, for example.

As an alternative, the inputs may serve as control inputs for a multiplexer tree, see Wannemacher, M "Das FPGA Kochbuch", ["The FPGA Cookbook"], FIG. 7.36: Logic block (CLB) of the XC4000 families, 1st Edition, International Thomson Publishing Company, Bonn, 1998, p. 197. The multiplexers may be realized in a logic-based manner and/or on the basis of transmission gates.

U.S. Pat. No. 6,529,040 B1 discloses an FPGA on the basis of a look-up table (LUT).

The logic basic cells using a look-up table which are disclosed in the prior art have disadvantages with regard to switching speed and/or interference immunity. The known solutions furthermore cannot be realized sufficiently compactly in terms of layout for many applications. Therefore, continued scaling is possible only with difficulty using the LUT solutions disclosed in the prior art.

As an alternative to the known LUT architectures, the prior art discloses interconnections comprising individual logic gates which can be used to form a desired logic function. However, such an architecture is restricted to the formation of very specific logic functions, whereas the overall scope of all possible logic mapping functions can only be realized in a very complicated manner using predetermined logic gates. The complicated logic gates are restricted with regard to the achievable switching speed, too. The limitation of the scope of the possible logic functions considerably complicates the automatic logic partitioning in the case of an FPGA design.

Another approach consists in making logic complex gates, which realize a combination of a plurality of logic inputs, flexibly interconnectable and in accomplishing a complete or almost complete coverage of the combinatorial function space through skilful combination of fewer than the possible inputs. However, such a realization has the disadvantage that flexibility outside the cell is used for the internal logic configuration of the cell and is thus limited. However, the functional mapping is generally complicated.

U.S. Pat. No. 5,568,067 A describes circuit arrangements that realize an XNOR logic function and an XOR logic function. The logic selection elements present there can only be allocated precisely one switching variable (designated by C there) or the complement thereof.

U.S. Pat. No. 6,285,218 B1 discloses a method and a circuit arrangement for implementing logic using mask-programmable logic gates. Programmable logic arrays and programmable dynamic gates are used.

SUMMARY OF THE INVENTION

The invention is based on the problem, in particular, of providing a logic basic cell, a logic basic cell arrangement and a logic device with an alternative architecture.

The invention provides a logic basic cell for forming a logic combination of two data signals in accordance with a logic function that can be implemented by means of a plurality of logic selection elements, having four data signal inputs, to which two data signals and the logically complementary data signals thereof can be applied. Furthermore, provision is made of a first logic selection element between a first data signal input and a second data signal input, a second logic selection element between the first data signal input and a fourth data signal input, a third logic selection element between the second data signal input and a third data signal input, and a fourth logic selection element between the third and the fourth data signal input. A fifth logic selection element is provided, which connects the second data signal input directly to the reference potential, and a sixth logic selection element connects the fourth data signal input directly to the reference potential. As an alternative, the fifth and the sixth logic selection element may also be connected such that they connect the first and respectively the third data signal input directly to the data signal output. It is furthermore possible for a fifth or sixth logic selection element to connect the second or fourth data signal input directly to the reference potential, while the other, sixth or fifth logic selection element connects the first or third data signal input directly to the data signal output. The logic basic cell according to the invention furthermore contains a data signal output, at which the logic combination of the two data signals in accordance with the logic function selected by means of the logic selection elements can be provided as output signal. The first logic selection element is preferably set in accordance with a first switching variable, the second logic selection element is preferably set in accordance with a second switching variable, the third logic selection element is preferably set in accordance with a third switching variable, the fourth logic selection element is preferably set in accordance with a fourth switching variable, the fifth logic selection element is set in accordance with a fifth switching variable, and the sixth logic selection element is set in accordance with a sixth switching variable. All possible logic functions for combination of the two data signals can be set by setting the sixth switching variables.

BRIEF DESCRIPTION OF THE DRAWINGS

Exemplary embodiments of the invention are illustrated in the figures and are explained in more detail below.

In the figures:

FIG. 2 shows a table illustrating the correlation between values of six logic selection signals in a first data signal path of transistors of a first conduction type and six further logic selection signals independent thereof in a second data signal path of transistors of a second conduction type and a logic function that is realized by the logic basic cell in accordance with FIG. 1;

FIG. 9 shows a logic basic cell in accordance with a seventh exemplary embodiment of the invention.

DETAILED DESCRIPTION OF PREFERRED EMBODIMENTS OF THE INVENTION

Figure 1:
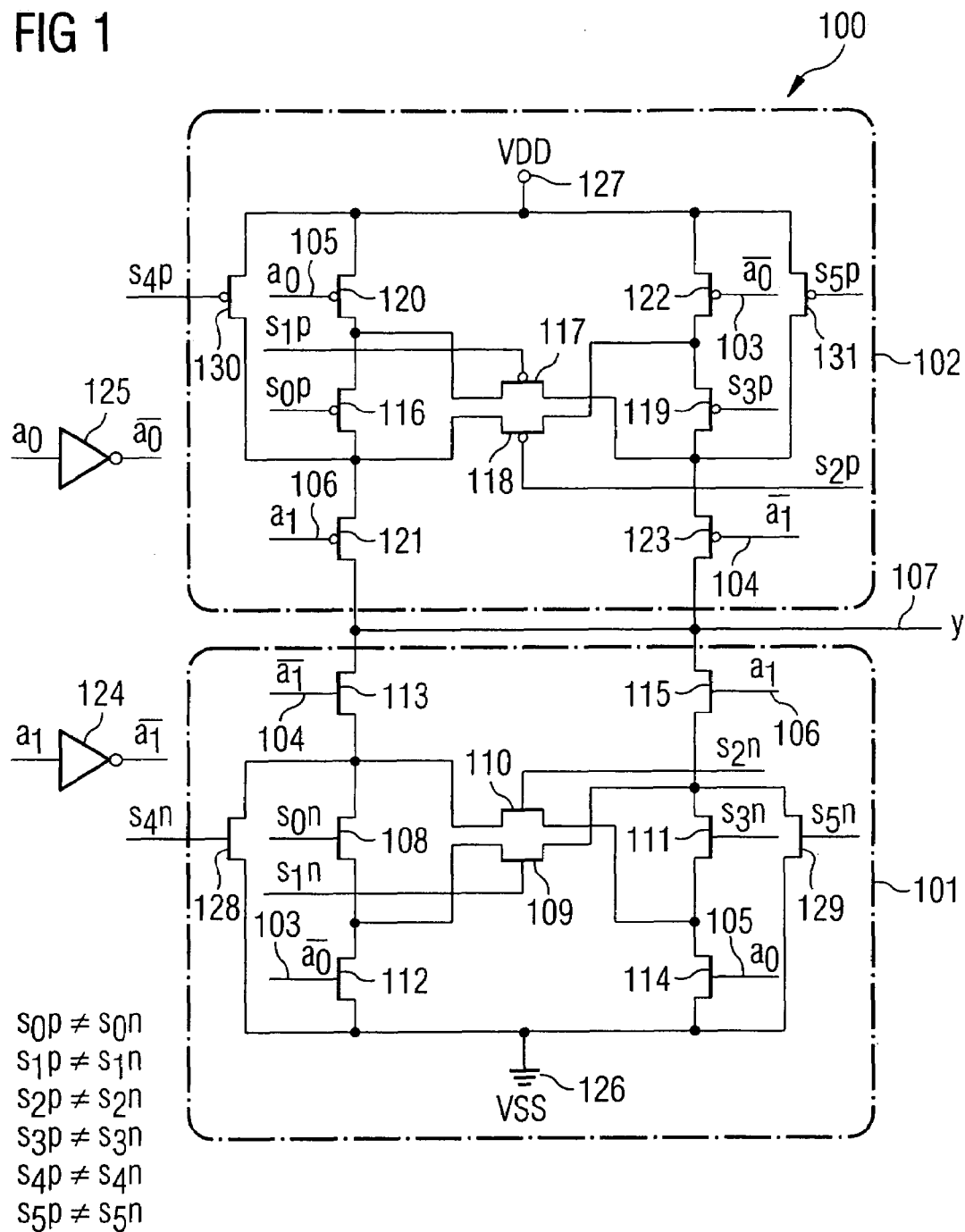
FIG. 1 shows a logic basic cell in accordance with a first exemplary embodiment of the invention.

The invention provides a logic basic cell for forming a logic combination of two data signals in accordance with a logic function that can be implemented by means of a plurality of logic selection elements, having four data signal inputs, to which two data signals and the logically complementary data signals thereof can be applied. Furthermore, provision is made of a first logic selection element between a first data signal input and a second data signal input, a second logic selection element between the first data signal input and a fourth data signal input, a third logic selection element between the second data signal input and a third data signal input, and a fourth logic selection element between the third and the fourth data signal input. A fifth logic selection element is provided, which connects the second data signal input directly to the reference potential, and a sixth logic selection element connects the fourth data signal input directly to the reference potential. As an alternative, the fifth and the sixth logic selection element may also be connected such that they connect the first and respectively the third data signal input directly to the data signal output. It is furthermore possible for a fifth or sixth logic selection element to connect the second or fourth data signal input directly to the reference potential, while the other, sixth or fifth logic selection element connects the first or third data signal input directly to the data signal output. The logic basic cell according to the invention furthermore contains a data signal output, at which the logic combination of the two data signals in accordance with the logic function selected by means of the logic selection elements can be provided as output signal. The first logic selection element is preferably set in accordance with a first switching variable, the second logic selection element is preferably set in accordance with a second switching variable, the third logic selection element is preferably set in accordance with a third switching variable, the fourth logic selection element is preferably set in accordance with a fourth switching variable, the fifth logic selection element is set in accordance with a fifth switching variable, and the sixth logic selection element is set in accordance with a sixth switching variable. All possible logic functions for combination of the two data signals can be set by setting the sixth switching variables.

What is achieved by means of the logic selection elements functioning as two additional switches, namely the fifth logic selection element and the sixth logic selection element, is that a reference voltage is applied to a switching variable or the complement thereof or that a switching variable or the complement thereof is applied to the data signal output, i.e. connected to the latter. The two logic selection elements are arranged within the logic basic cell and connected up to the other components of the logic basic cell in such a way that the functionality described above is achieved.

The logic basic cell arrangement according to the invention for forming a logic combination of three data signals contains a first and a second logic basic cell having the features described above, to the data signal inputs of which the two data signals and the logically complementary data signals thereof can be applied. Furthermore, the logic basic cell arrangement contains a multiplexer, at the first data input of which the output signal of the first logic basic cell is provided, at the second data input of which the output signal of the second logic basic cell is provided, and at the control input of which a third data signal is provided. The logic combination of the three data signals is provided as output signal at a data signal output of the logic basic cell arrangement.

The logic device according to the invention for forming a logic combination of more than three data signals contains a plurality of logic basic cell arrangements having the features described above.

One basic idea of the invention can be seen in the fact that a logic basic cell is provided, in particular for use in regular cell arrays (FPGA, MPGA), in a circuitry realization such that a complete mapping of the combinatorial function space over n inputs is achieved in conjunction with a very small number of required components (e.g. transistors). In other words, the logic basic cell according to the invention makes it possible to realize any possible logic combination of two data signals in an optimised interconnection of logic selection elements and data signal inputs.

Clearly, a first data signal, a complementary data signal with respect to the first data signal, a second data signal and a complementary data signal with respect to the second data signal are applied to the four data signal inputs. The logic selection elements are configured in such a way that they determine the logic function realized by the logic basic cell according to the invention. This may be achieved e.g. by means of a hardwired realization of the logic selection elements, so that, in this case, the logic function is determined by means of the invariable wiring of the data signal inputs that is prescribed by the logic selection elements. As an alternative, the logic selection elements may be provided for example as logic selection transistors, the logic function to be realized being prescribed by means of applying logic selection signals to the gate terminals of said logic selection transistors.

The architecture of the logic basic cell according to the invention constitutes a very simple arrangement which enables any possible logic function to be realized with a very low circuitry outlay. The particularly compact realization of the logic basic cell according to the invention saves chip area and thus enables continued miniaturization.

On account of the miniaturatizability of the logic basic cell of the invention, in the case of which only very few circuitry components are used, the signal paths are kept short, an energy-saving operability is made possible and a high processing speed is achieved in conjunction with high flexibility with regard to the logic functions to be realized.

To put it another way, the logic basic cell according to the invention constitutes a greatly improved or optimised realization of a logic function of two inputs.

In accordance with Boolean algebra, a complete logic function f of n+1 inputs or data signals $a_n, a_{n-1}, \ldots, a_1, a_0$ can be decomposed into two subfunctions $f_0, f_1$ of n inputs with the aid of the mapping specification $$f(a_n, a_{n-1}, \ldots, a_1, a_0) = \overline{a}_n \cdot f_0(a_{n-1}, \ldots, a_1, a_0) \vee a_n \cdot f_1(a_{n-1}, \ldots, a_1, a_0) \quad (1).$$

In other words, the logic function f of n+1 inputs is reduced to two logic subfunctions $f_0, f_1$ having n inputs in each case.

Clearly, for the special case n+1=3, each of the functions $f_0, f_1$ can be realized by means of a logic basic cell according to the invention. For n+1=3, the combination in accordance with the equation (1) is realized by a multiplexer, at the data signal inputs of which the output signals of the two logic basic cells $f_0, f_1$ are provided and at the control input of which the data signal $a_2$ (or the logically complementary data signal $\overline{a}_2$ with respect to $a_2$) is provided. Such a configuration corresponds to the logic basic cell arrangement according to the invention.

To put it another way, the relationship of equation (1) is realized by means of the multiplexer of the logic basic cell arrangement. With complete induction, it can be shown on the basis of equation (1) that an arbitrarily complex logic function can be reduced to subfunctions of two inputs. Since a multiplexer can be constructed very compactly (e.g. multiplexer comprising two diametrically oppositely switching transmission gates with four transistors), such a decomposition is very advantageous.

The logic basic cell according to the invention provides a very favorable realization of a logic function of two inputs. In order to represent such a function of two inputs $y=f(a_1, a_0)$, the data signals $a_0, \overline{a}_0, a_1, \overline{a}_1$ are provided at four data signal inputs, e.g. at the gate terminals of four data signal transistors. Furthermore, the four logic selection elements are provided, e.g. realized as logic selection transistors, for the construction of all four possible product terms with additional use of the fifth logic selection element and the sixth logic selection element.

In standard CMOS technology, logic gates are composed of a pull-up path and a pull-down path. The above argumentation holds true in the same way for each of the two paths, so that twenty transistors suffice for a realization of all functions of two inputs in CMOS logic if the configuration switches or logic selection elements are embodied as logic selection transistors.

The advantages of the logic basic cell according to the invention are the small area in conjunction with high switching speed of the cell and in conjunction with a very low power consumption. These advantages are achieved without limiting the flexibility with regard to the logic function that can be realized.

Preferred developments of the invention emerge from the dependent claims.

The logic selection elements may be invariable hardware elements. In accordance with this realization, the desired logic function is fixedly prescribed once, to be precise by means of wiring the four data signal inputs in a prescribed manner. The coupling between the individual data signals that are provided at the data signal inputs is prescribed by the interconnection of the logic selection elements and thus leads to an unambiguous logic function.

In accordance with the configuration described, the logic selection elements may be realized by means of a plurality of metallization planes and/or vias.

In the case of the logic basic cell according to the invention, the first logic selection element may be a first logic transistor, which can be controlled by means of a first logic selection signal. The second logic selection element may be a second logic transistor, which can be controlled by means of a second logic selection signal. The third logic selection element may be a logic transistor which can be controlled by means of a third logic selection signal, and the fourth logic selection element may be a fourth logic transistor, which can be controlled by means of a fourth logic selection signal. The fifth logic selection element may be a fifth logic transistor, which can be controlled by means of a fifth logic selection signal. The sixth logic selection element may be a sixth logic transistor, which can be controlled by means of a sixth logic selection signal. In accordance with this configuration, six logic selection signals are applied to the logic transistors, preferably to the gate terminals thereof, thereby realizing a very specific coupling of the data signals at the data signal inputs. The logic function that is realized is prescribed in accordance with this specific coupling, which can be prescribed in a variable manner.

Furthermore, the logic basic cell of the invention may have four data signal transistors, at the gate terminals of which in each case one of the data signals or the logically complementary data signals can be provided. In the case of this configuration, the four data signals, i.e. the first data signal and its logic complement and also the second data signal and its logic complement, are coupled into the logic basic cell according to the invention via gate terminals of four data signal transistors.

In accordance with the configuration described, a first data signal transistor may be connected up in such a way that its first source/drain terminal is coupled to a first source/drain terminal of the first logic transistor and to a second source/drain terminal of the second logic transistor. Furthermore, the second source/drain terminal of the second data signal transistor may be coupled to a first source/drain terminal of a third data signal transistor.

The third data signal transistor may be connected up in such a way that its second source/drain terminal is coupled to a first source/drain terminal of the fourth logic transistor and to a first source/drain terminal of the third logic transistor.

A second data signal transistor may be connected up in such a way that its first source/drain terminal is coupled to a second source/drain terminal of the first logic transistor and to a second source/drain terminal of the third logic transistor. A second source/drain terminal of the second data signal transistor may be coupled to a first source/drain terminal of a fourth data signal transistor.

The fourth data signal transistor may be connected up in such a way that its second source/drain terminal is coupled to a second source/drain terminal of the second logic transistor and to a second source/drain terminal of the fourth logic transistor.

Furthermore, the fifth logic transistor may be connected up in such a way that its first source/drain terminal is connected up to the first source/drain terminal of the second data signal transistor, the second source/drain terminal of the first logic transistor and the second source/drain terminal of the third logic transistor;

second source/drain terminal is connected up to the second source/drain terminal of the first data signal transistor and the first source/drain terminal of the third data signal transistor.

As an alternative, the fifth logic transistor may be connected up in such a way that its first source/drain terminal is connected up to the second source/drain terminal of the second data signal transistor and the first source/drain terminal of the fourth data signal transistor;

second source/drain terminal is connected up to the first source/drain terminal of the first data signal transistor, the first source/drain terminal of the first logic transistor and the first source/drain terminal of the second logic transistor.

The sixth logic transistor may be connected up in such a way that its first source/drain terminal is connected up to the second source/drain terminal of the fourth data signal transistor, the second source/drain terminal of the second logic transistor and the second source/drain terminal of the fourth logic transistor, second source/drain terminal is connected up to the second source/drain terminal of the first data signal transistor and the first source/drain terminal of the third data signal transistor.

As an alternative, the sixth logic transistor may be connected up in such a way that its first source/drain terminal is connected up to the second source/drain terminal of the second data signal transistor and to the first source/drain terminal of the fourth data signal transistor;

second source/drain terminal is connected up to the second source/drain terminal of the third data signal transistor, the first source/drain terminal of the third logic transistor and the first source/drain terminal of the fourth logic transistor.

The described interconnection of the four data signal transistors with the six logic transistors provides a preferred circuitry realization of a logic basic cell for realizing all possible logic functions for combination of the data signals, and this with a very low circuitry outlay.

The logic basic cell according to the invention may have an evaluation switch coupled to the data signal output and a precharge switch, which switches are connected up and can be controlled in such a way that the output signal is provided at an output of the logic basic cell when the evaluation switch is closed (i.e. permits signal transfer) and the precharge switch is open (i.e. does not permit signal transfer), and a reference signal is provided at an output of the logic basic cell when the precharge switch is closed and the evaluation switch is open. The evaluation switch and the precharge switch may in each case be transistors, in particular field effect transistors or bipolar transistors.

In accordance with this configuration, the output can be charged to the reference potential by means of the precharge switch (precharge phase), for example during the first half of a switching period of the logic basic cell. By means of the evaluation switch, the output signal processed in accordance with the prescribed logic function can be provided at the output, for example during the second half of the switching period of the logic basic cell (evaluate phase).

Each of the logic transistors and each of the data signal transistors of the logic basic cell may be a transistor of a first conduction type, the transistors of the first conduction type forming a first data signal path. A second data signal path may be formed from transistors of a second conduction type, which is complementary to the first conduction type, in which case, for each of the transistors of the first data signal path, a correspondingly connected up transistor is provided in the second data signal path.

The two data signal paths are antisymmetrical with respect to one another, the logic function being realized using transistors of a first conduction type (p conduction type or n conduction type) in the first data signal path and from transistors of a second conduction type (n conduction type or p conduction type) in the second signal path.

The first conduction type may be the p conduction type and the second conduction type may be the n conduction type. As an alternative, the first conduction type may be the n conduction type and the second conduction type may be the p conduction type.

Consequently, the logic basic cell according to the invention may be set up as a CMOS logic basic cell.

The logic basic cell may furthermore have a first inverter for forming a logically complementary data signal with respect to a first data signal, and a second inverter for forming a logically complementary data signal with respect to a second data signal.

The first data signal and the second data signal may be provided at inputs of the logic basic cell, and the respective complementary or inverse data signal may be generated from them using a respective inverter and be coupled into the logic basic cell for logic processing.

Two of the data signal transistors of the logic basic cell may be transistors of a first conduction type and two data signal transistors may be transistors of a second conduction type, which is complementary to the first conduction type, the four data signal transistors forming a first data signal path. Furthermore, a second data signal path may be formed from transistors, in which case, for each of the transistors of the first data signal path, a correspondingly connected up transistor is provided in a second data signal path. Corresponding transistors of the first and of the second data signal path are transistors of in each case the same conduction type.

In accordance with this configuration, transistors of both conduction types (n conduction type and p conduction type) are in each case provided in the two data signal paths. The inverters which, in accordance with a different exemplary embodiment, may be provided for forming the logically complementary values with respect to the data signals $a_0$, $a_1$ can be obviated with this realization.

In this scenario, it is advantageous for the transistors of a respective data signal path to be provided with electrical supply potentials such that different threshold voltages of transistors of the first and of the second conduction type are completely or partly compensated for.

Clearly, the different switching behaviour of p-MOS and n-MOS transistors is utilized in accordance with the configuration described. By utilizing this different switching behavior, forming the respective logically complementary values with respect to the data signals $a_1$, $a_0$ by means of inverters may be dispensable. However, p-MOS and n-MOS transistors may have different values of threshold voltages that are compensated for by means of providing different supply potentials.

The logic basic cell according to the invention may be provided as an application-specific integrated circuit. In particular, the logic basic cell may be provided as Programmable Logical Device (PLD), as Field-Programmable Gate Array (FPGA) or as mask-programmed Application-Specific Integrated Circuit (mASIC).

Even though configurations of the logic basic cell have been described, these configurations are nevertheless also intended to apply to the logic basic cell arrangement according to the invention and the logic device according to the invention.

Identical or similar components in different figures are provided with identical reference numerals.

The illustrations in the figures are schematic and not to scale.

A description is given below, with reference to FIG. 1, of a logic basic cell 100 in accordance with a first exemplary embodiment of the invention.

The logic basic cell 100 has a first data signal path 101 comprising n-MOS transistors and a second data signal path 102 comprising p-MOS transistors.

The structure of the first data signal path 101 is described in more detail below.

The first data signal path 101 has a first data signal input 103, at which a first data signal $\bar{a}_0$ is provided. Furthermore, a second data signal $\bar{a}_1$ is provided at a second data signal input 104. A complementary data signal $a_0$ with respect to the first data signal $\bar{a}_0$ is provided at a third data signal input 105. Moreover, a complementary data signal $a_1$ with respect to the second data signal $\bar{a}_1$ is provided at a fourth data signal input 106.

The output signal y of the logic combination of the data signals $\bar{a}_0$, $\bar{a}_1$ (and the logically complementary signals $a_0$, $a_1$ thereof) in accordance with a selected logic function is provided at a data signal output 107.

A first n-MOS logic selection transistor 108 is provided as a first logic selection element between the first data signal input 103 and the second data signal input 104. The first n-MOS logic selection transistor 108 can be controlled by means of a first n-MOS transistor logic selection signal $s_0n$. Furthermore, a second n-MOS logic selection transistor 109 is provided as a second logic selection element between the first data signal input 103 and the fourth data signal input 106. The second n-MOS logic selection transistor 109 can be controlled by means of a second n-MOS transistor logic selection signal $s_1n$. Moreover, a third n-MOS logic selection transistor 110 is provided as third logic selection element between the second data signal input 104 and the third data signal input 105, which third logic selection transistor 110 can be controlled by means of a third n-MOS transistor logic selection signal $s_2n$. A fourth n-MOS logic selection transistor 111 is provided as a fourth logic selection element between the third data signal input 105 and the fourth data signal input 106, which fourth n-MOS logic selection transistor 111 can be controlled by means of a fourth n-MOS transistor logic selection signal $s_3n$.

The first data signal input 103 is coupled to the gate region of a first n-MOS data signal transistor 112. The second data signal input 104 is coupled to the gate region of a second n-MOS data signal transistor 113. The third data signal input 105 is coupled to the gate region of a third n-MOS data signal transistor 114. The fourth data signal input 106 is coupled to the gate region of a fourth n-MOS data signal transistor 115.

The first n-MOS data signal transistor 112 is connected up in such a way that its first source/drain terminal is coupled to a first source/drain terminal of the first n-MOS logic selection transistor 108 and to a first source/drain terminal of the second n-MOS logic selection transistor 109. A second source/drain terminal of the first n-MOS data signal transistor 112 is coupled to a first source/drain terminal of the third n-MOS data signal transistor 114, and is brought to the electrical supply potential 126. The third n-MOS data signal transistor 114 is connected up in such a way that its second source/drain terminal is coupled to a first source/drain terminal of the fourth n-MOS logic selection transistor 111 and to a first source/drain terminal of the third n-MOS logic selection transistor 110.

The second n-MOS data signal transistor 113 is connected up in such a way that its first source/drain terminal is coupled to a second source/drain terminal of the first n-MOS logic selection transistor 108 and to a second source/drain terminal of the third n-MOS logic selection transistor 110. A second source/drain terminal of the second n-MOS data signal transistor 113 is coupled to a first source/drain terminal of the fourth n-MOS data signal transistor 115. The fourth n-MOS data signal transistor 115 is connected up in such a way that its second source/drain terminal is coupled to a second source/drain terminal of the second n-MOS logic selection transistor 109 and to a second source/drain terminal of the fourth n-MOS logic selection transistor 111. The second source/drain terminal of the second n-MOS data signal transistor 113 and the first source/drain terminal of the fourth n-MOS data signal transistor 115 are coupled to the data signal output 107 y.

The complementary data signal $\bar{a}_1$ with respect to the second data signal $a_1$ can be generated from said second data signal $a_1$ by means of a first inverter 124.

The complementary data signal $\bar{a}_0$ with respect to the first data signal $a_0$ can be generated from said first data signal $a_0$ by means of a second inverter 125.

Furthermore, a fifth n-MOS logic selection transistor 128 is provided as a fifth logic selection element. The first source/drain terminal of the fifth n-MOS logic selection transistor 128 is coupled to the first source/drain terminal of the second n-MOS data signal transistor 113, the second source/drain terminal of the first n-MOS logic selection transistor 108 and also to the second source/drain terminal of the third n-MOS logic selection transistor 110. The second source/drain terminal of the fifth n-MOS logic selection transistor 128 is coupled to the electrical supply potential 126, the second source/drain terminal of the first n-MOS data signal transistor 112 and the first source/drain terminal of the third n-MOS data signal transistor 114. The fifth n-MOS logic selection transistor 128 can be controlled by means of a fifth n-MOS transistor logic selection signal $s_4n$.

Furthermore, a sixth n-MOS logic selection transistor 129 is provided as a sixth logic selection element. The first source/drain terminal of the sixth n-MOS logic selection transistor 129 is coupled to the second source/drain terminal of the fourth n-MOS data signal transistor 115, the second source/drain terminal of the fourth n-MOS logic selection transistor 111 and to the second source/drain terminal of the second n-MOS logic selection transistor 109. The second source/drain terminal of the sixth n-MOS logic selection transistor 129 is coupled to the electrical supply potential 126, the second source/drain terminal of the first n-MOS data signal transistor 112 and the first source/drain terminal of the third n-MOS data signal transistor 114 and also to the second source/drain terminal of the fifth n-MOS logic selection transistor 128. The sixth n-MOS logic selection transistor 129 can be controlled by means of a sixth n-MOS transistor logic selection signal s$_5$n.

The construction of the second data signal path 102 is described below.

This path is connected up antisymmetrically with respect to the first data signal path 101.

Instead of a first n-MOS logic selection transistor 108, a first p-MOS logic selection transistor 116 is provided in the second data signal path 102. The second n-MOS logic selection transistor 109 is replaced by a second p-MOS logic selection transistor 117. The third n-MOS logic selection transistor 110 is replaced by a third p-MOS logic selection transistor 118. The fourth n-MOS logic selection transistor 111 is replaced by a fourth p-MOS logic selection transistor 119. The first n-MOS data signal transistor 112 is replaced by a first p-MOS data signal transistor 120. The second n-MOS data signal transistor 113 is replaced by a second p-MOS data signal transistor 121. The third n-MOS data signal transistor 114 is replaced by a third p-MOS data signal transistor 122. The fourth n-MOS data signal transistor 115 is replaced by a fourth p-MOS data signal transistor 123.

The signal at the gate terminals of the data signal transistors 120 to 123 of the p-MOS data signal path 102 is the respective inverted signal compared with the signals at the gate terminals of the data signal transistors 112 to 115 of the n-MOS data signal path 101. Thus, $a_0$ is present at the gate of the first p-MOS data signal transistor 120, whereas $\bar{a}_0$ is present at the gate of the first n-MOS data signal transistor 112. $a_1$ is present at the gate of the second p-MOS data signal transistor 121, whereas $\bar{a}_1$ is present at the gate of the second n-MOS data signal transistor 113. $\bar{a}_0$ is present at the gate of the third p-MOS data signal transistor 122, whereas $a_0$ is present at the gate of the third n-MOS data signal transistor 114, and $\bar{a}_1$ is present at the gate of the fourth p-MOS data signal transistor 123, whereas $a_1$ is present at the gate of the fourth n-MOS data signal transistor 115.

Asymmetry of the two data signal paths 101, 102 is to be understood to mean that although the arrangement thereof with respect to one another is essentially mirror-symmetrical, the conduction types of the mutually corresponding transistors are complementary to one another, and the data signals at the inputs of mutually corresponding data signal transistors are likewise complementary to one another.

The first p-MOS logic selection transistor 116 can be controlled by means of a first p-MOS transistor logic selection signal s$_0$p. The second p-MOS logic selection transistor 117 can be controlled by means of a second p-MOS transistor logic selection signal s$_1$p. The third p-MOS logic selection transistor 118 can be controlled by means of a third p-MOS transistor logic selection signal s$_2$p. The fourth p-MOS logic selection transistor 118 can be controlled by means of a fourth p-MOS transistor logic selection signal s$_3$p.

The source-drain terminals—coupled to one another—of the first p-MOS data signal transistor 120 and of the third p-MOS data signal transistor 122 are brought to the supply potential 127. Furthermore, the source/drain terminals—coupled to one another—of the second p-MOS data signal transistor 121 and of the fourth p-MOS data signal transistor 123 are coupled to the data signal output 107.

Furthermore, a fifth p-MOS logic selection transistor 130 is provided as a fifth logic selection element. The first source/drain terminal of the fifth p-MOS logic selection transistor 130 is coupled to the first source/drain terminal of the second p-MOS data signal transistor 121, the second source/drain terminal of the first p-MOS logic selection transistor 116 and also to the second source/drain terminal of the third p-MOS logic selection transistor 118. The second source/drain terminal of the fifth p-MOS logic selection transistor 130 is coupled to the electrical supply potential 127, the second source/drain terminal of the first p-MOS data signal transistor 120 and the first source/drain terminal of the third p-MOS data signal transistor 122. The fifth p-MOS logic selection transistor 130 can be controlled by means of a fifth p-MOS transistor logic selection signal s$_4$p.

Furthermore, a sixth p-MOS logic selection transistor 131 is provided as a sixth logic selection element. The first source/drain terminal of the sixth p-MOS logic selection transistor 131 is coupled to the second source/drain terminal of the fourth p-MOS data signal transistor 123, the second source/drain terminal of the fourth p-MOS logic selection transistor 119 and to the second source/drain terminal of the second p-MOS logic selection transistor 117. The second source/drain terminal of the sixth p-MOS logic selection transistor 131 is coupled to the electrical supply potential 127, the second source/drain terminal of the first p-MOS data signal transistor 120 and the first source/drain terminal of the third p-MOS data signal transistor 122 and also to the second source/drain terminal of the fifth p-MOS logic selection transistor 130. The sixth n-MOS logic selection transistor 131 can be controlled by means of a sixth p-MOS transistor logic selection signal s$_5$p.

It should be noted that the n-MOS transistor logic selection signals are different signals than the p-MOS transistor logic selection signals and these can thus be set independently of one another (although they may also have the same logic value). The independence of the setability of the individual signals relative to one another is symbolized by the following specifications:

$s_0p \neq s_0n$;

$s_1 \neq s_1n$;

$s_2p \neq s_2n$;

$s_3p \neq s_3n$;

$s_4p \neq s_4n$;

$s_5p \neq s_5n$.

The functionality of the logic basic cell 100 is described below.

The logic basic cell 100 constitutes a realization of an optimised logic basic cell of two input signals $a_0$, $a_1$ (and of the logically complementary signals $\bar{a}_0$, $\bar{a}_1$ thereof) using static standard CMOS circuitry. By means of prescribing the first to sixth n-MOS transistor logic selection signals s$_0$n to s$_5$n and the first to sixth p-MOS transistor logic selection signals sop to s$_5$p, it is defined whether the channel regions of the logic selection transistors 108 to 111 and 128 and 129 and, respectively, 116 to 119 and 130 and 131 are conducting or nonconducting. As a result, specific signal paths within the data signal paths 101 and 102 are permitted, and others are precluded. This leads to a defined combination of the input signals $a_0$, $a_1$, $\bar{a}_0$, $\bar{a}_1$ in accordance with a logic function, which are prescribed by means of prescribing the logic selection signals s$_0$n to s$_5$n and s$_0$p to s$_5$p. The combination of the data signals in accordance with the prescribed logic function leads to an output signal y provided at the data signal output 107.

Figure 7:
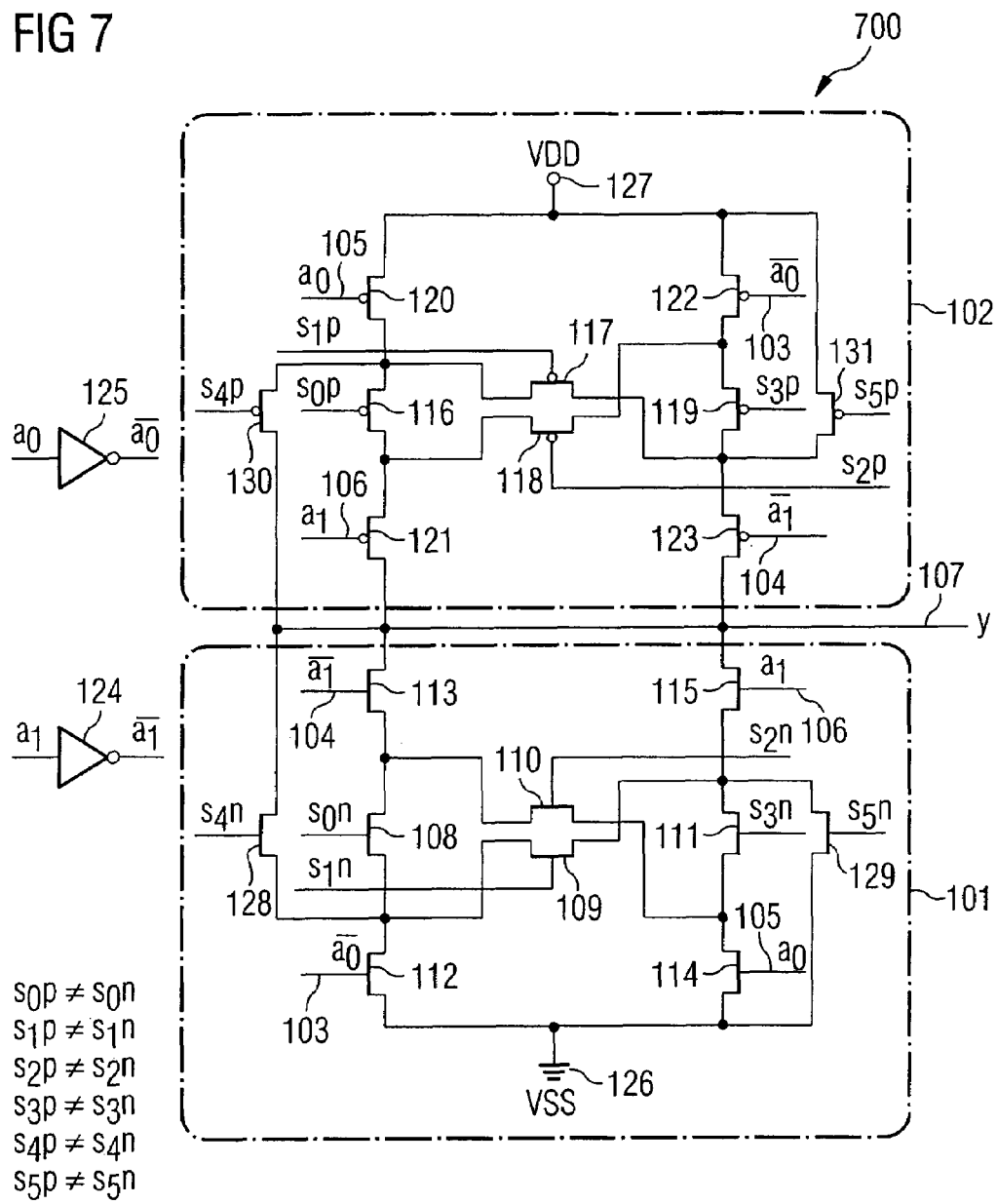
FIG. 7 shows a logic basic cell in accordance with a fifth exemplary embodiment of the invention.
Figure 8:
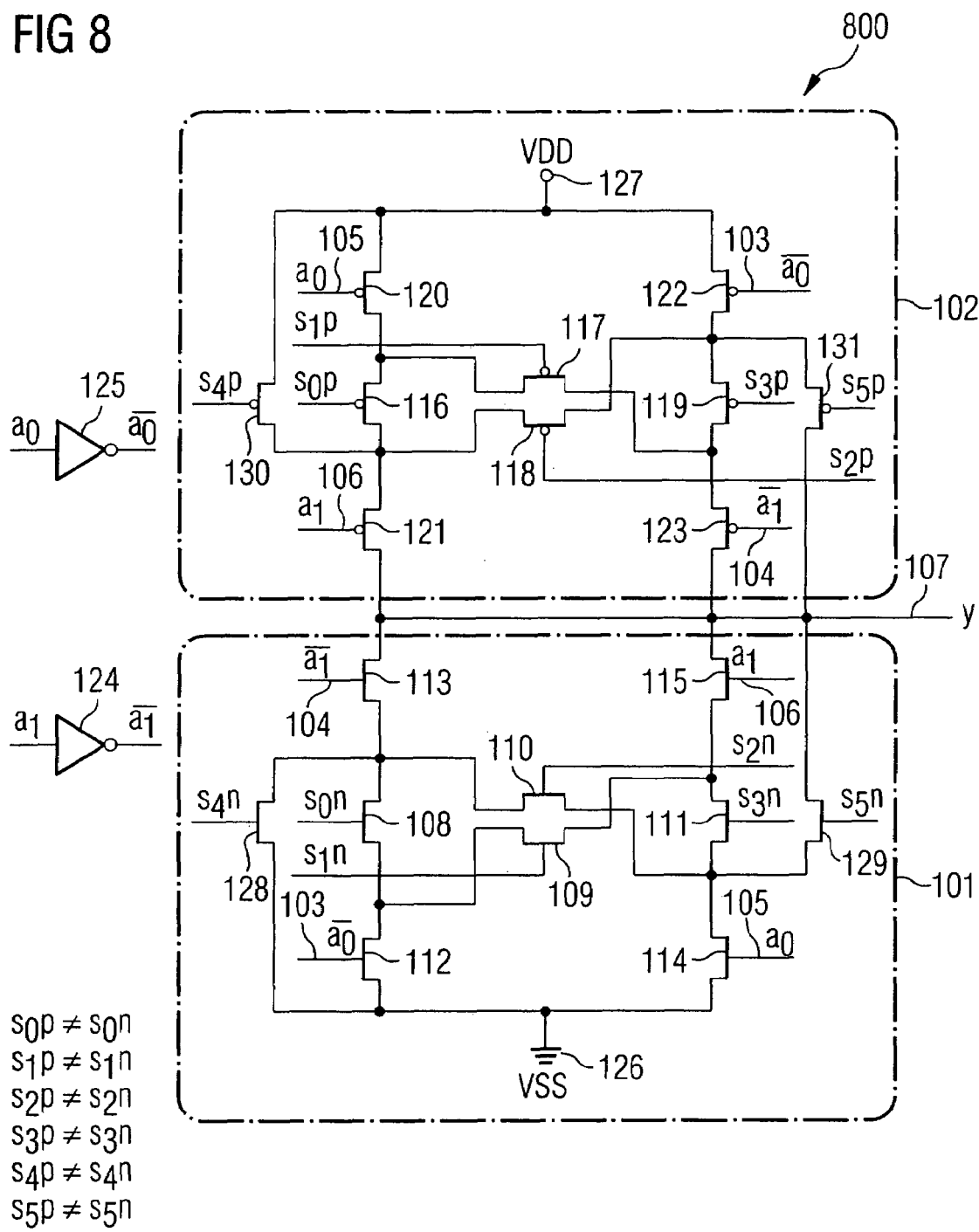
FIG. 8 shows a logic basic cell in accordance with a sixth exemplary embodiment of the invention.

The logic basic cell 100 illustrated in FIG. 1 has the advantage, in particular, of a very low capacitive loading at the data signal output 107 and, in the case where the dimensioning of the transistors is of the same magnitude, thus has a speed advantage of the logic basic cell compared with the embodiments of the invention that are illustrated in FIGS. 7 to 9.

The table 200 shown in FIG. 2 specifies which logic function y will be prescribed for the different permutations of the logic selection signals $s_0n$ to $s_5n$ and sop to $s_5p$. By way of example, the data signals $a_0$ and $a_1$ are combined in accordance with an OR logic function if the first n-MOS transistor logic selection signal $s_0n$ has the logic value "1";
the second n-MOS transistor logic selection signal $s_1n$ has the logic value "0";
the third n-MOS transistor logic selection signal $s_2n$ has the logic value "0";
the fourth n-MOS transistor logic selection signal $s_3n$ has the logic value "0";
the fifth n-MOS transistor logic selection signal $s_4n$ has the logic value "0";
the sixth n-MOS transistor logic selection signal $s_5n$ has the logic value "0";
the first p-MOS transistor logic selection signal sop has the logic value "1";
the second p-MOS transistor logic selection signal sip has the logic value "1";
the third p-MOS transistor logic selection signal $s_2p$ has the logic value "0";
the fourth p-MOS transistor logic selection signal $s_3p$ has the logic value "1";
the fifth p-MOS transistor logic selection signal $s_4p$ has the logic value "1";
the sixth p-MOS transistor logic selection signal $s_5p$ has the logic value "0".

Table 200 indicates the allocation of the switching variables $s_0n$, $s_1n$, $s_2n$, $s_3n$, $s_4n$, $s_5n$, $s_0p$, $s_1p$, $s_2p$, $s_3p$, $s_4p$, $s_5p$ with the aid of which all possible sixteen logic functions for combination of two data signals $a_0$ and $a_1$ can be set. More-significant complex functions can be constructed using equation (1), using a logic basic cell arrangement or logic device according to the invention.

It should be noted in this connection that, for some logic functions, the switch positions (logic value "1" or logic value "0" of the individual switching variables $s_0n$, $s_1n$, $s_2n$, $s_3n$, $s_4n$, $s_5n$, $s_0p$, $s_1p$, $s_2p$, $s_3p$, $s_4p$, $s_5p$) may also be different in order to realize the same respective logic function.

A description is given below, with reference to FIG. 3, of a logic basic cell 300 in accordance with a second exemplary embodiment of the invention.

Figure 3:
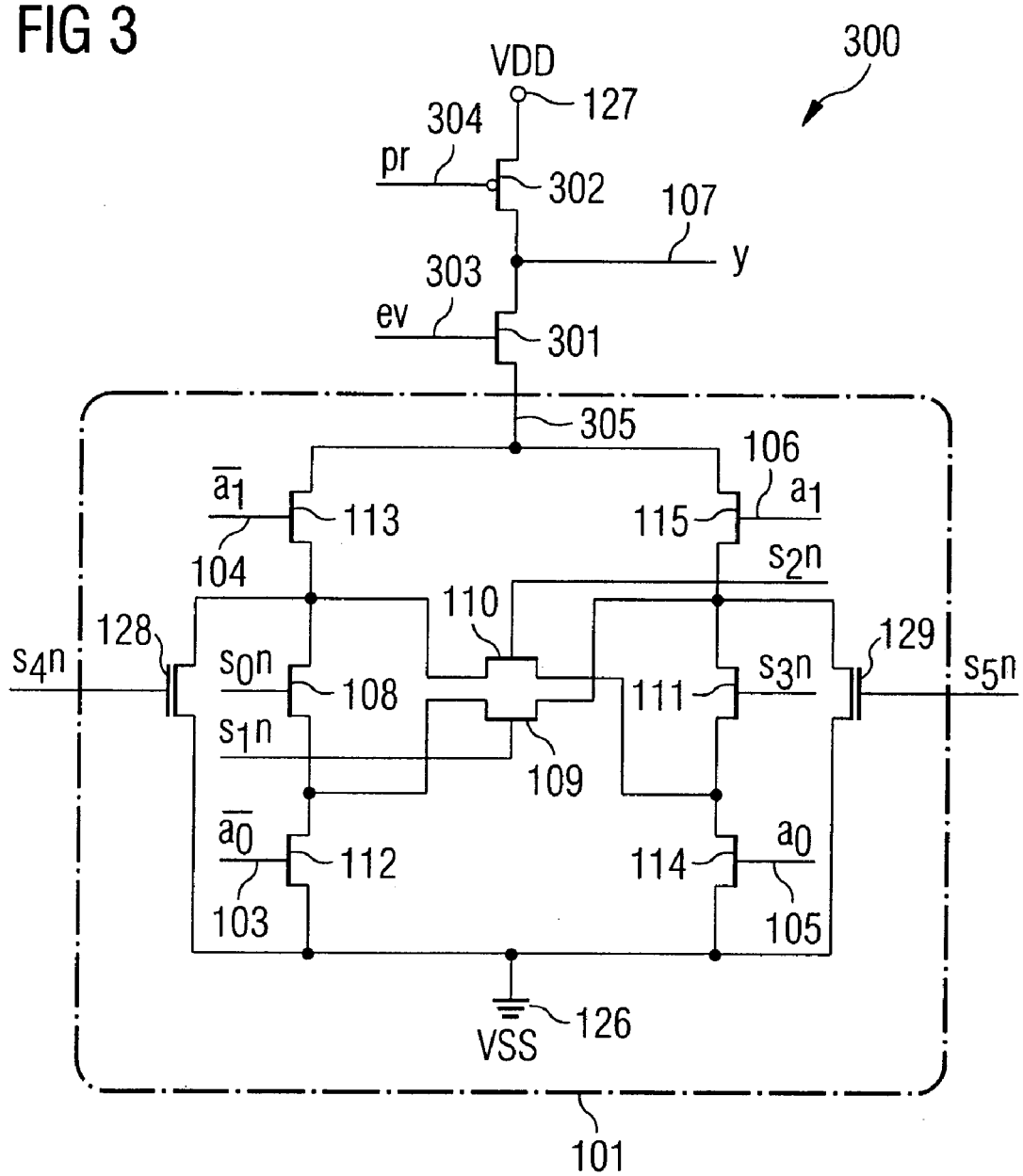
FIG. 3 shows a logic basic cell in accordance with a second exemplary embodiment of the invention.

In contrast to the logic basic cell 100 from FIG. 1, the logic basic cell 300 from FIG. 3 is not constructed using static CMOS logic. The logic basic cell 300 is formed only from a data signal path 101, the internal interconnection of which corresponds to the interconnection of the transistors in the first data signal path 101 of FIG. 1. Consequently, in contrast to the logic basic cell 100, the logic basic cell 300 is provided with precisely one data signal path 101 comprising n-MOS field effect transistors 108 to 115 and 128 and 129, whereas the data signal path 102 comprising p-MOS field effect transistors 116 to 122 as shown in FIG. 1 is obviated.

An output signal representing the result of the processing of the data signals $a_0$, $a_1$ of the selected logic function is provided at a data signal path output 305 of the data signal path 101, which output is coupled to a first source/drain region of an n-MOS evaluation transistor 301. Given a corresponding signal at an evaluation input 303 coupled to the gate region of the evaluation transistor 301, the processed output signal is present at an output 107 of the logic basic cell 300, said output being coupled to the second source/drain region of the evaluation transistor 301. The second source/drain region of the evaluation transistor 301 is coupled to a first source/drain region of a p-MOS precharge transistor 302, the second source/drain region of which is brought to the electrical supply potential 127. Given a corresponding signal at a precharge input 304 coupled to the gate region of the precharge transistor 302, the electrical supply potential 127 is present as reference potential at the output 107 of the logic basic cell 300, said output being coupled to the first source/drain region of the precharge transistor 302.

Consequently, compared with FIG. 1, the path comprising p-MOS transistors is obviated in FIG. 3. The pull-down network 101 is formed from n-MOS transistors in FIG. 3 as in FIG. 1, whereas in FIG. 3 the pull-up network 102 comprising p-MOS transistors is obviated and replaced by a statically or dynamically configured precharge transistor 302. As an alternative to FIG. 3, the signal path comprising n-MOS transistors in FIG. 1 may also be obviated and replaced by a precharge transistor, in which case a signal path comprising p-MOS transistors is provided.

Consequently, in the case of the non-static CMOS realization of the logic basic cell 300 according to the invention in accordance with FIG. 3, a pull-up transistor 302 is provided, which precharges the output 107 y to a logic value "1" in a partial interval of the switching time of the logic basic cell 300 (precharge phase), whereas in the rest of the switching time the selected logic function is calculated in the pull-down path 101 realized according to the invention (evaluation phase).

All circuits which contain at least one of the two paths (pull-up or pull-down path) of the structure of FIG. 1 likewise constitute a logic basic cell in the sense of the invention, irrespective of how the respective opposite logic potential is realized.

A description is given below, with reference to FIG. 4, of a logic basic cell 400 in accordance with a preferred exemplary embodiment of the invention.

Figure 4:
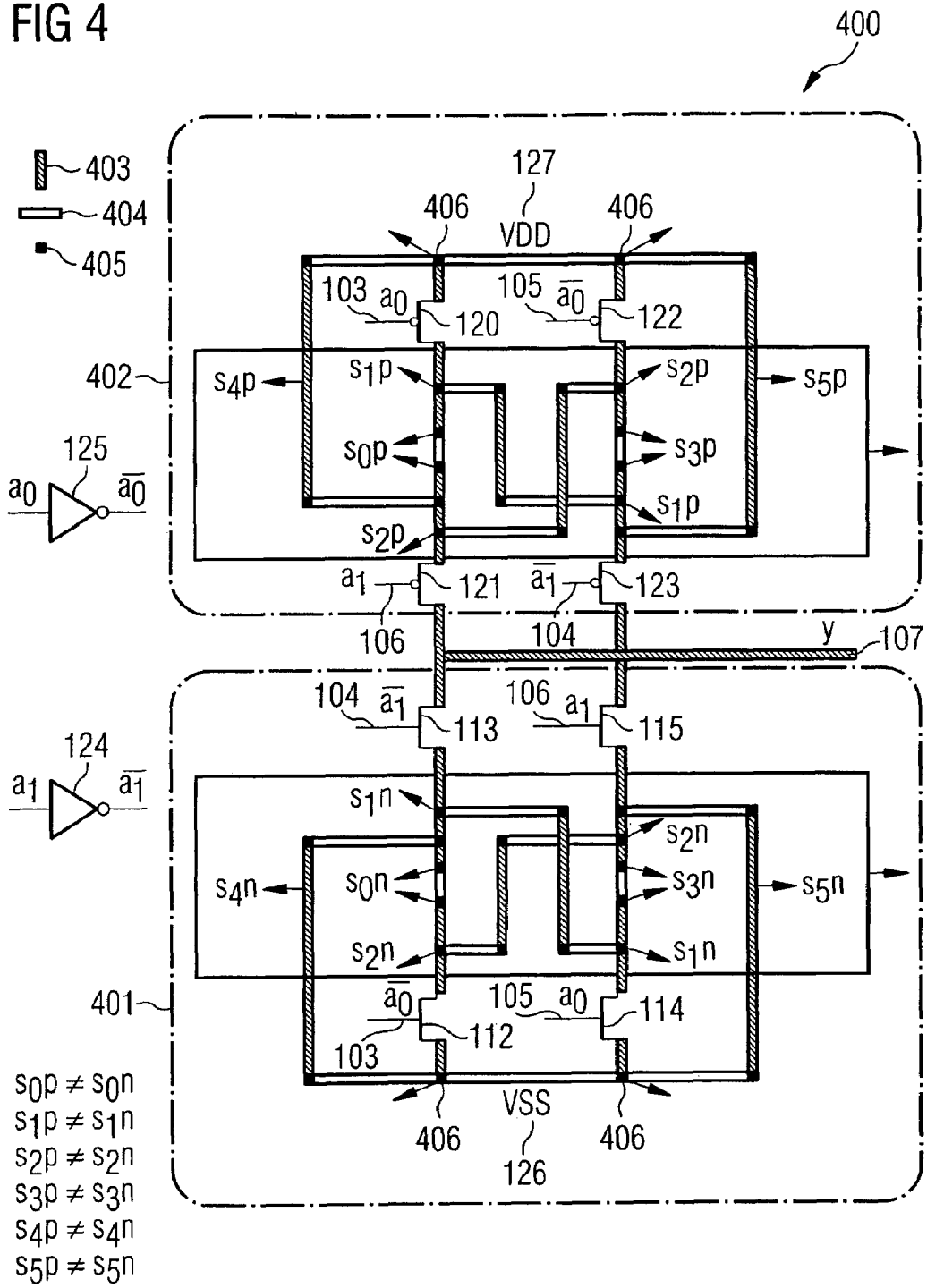
FIG. 4 shows a logic basic cell in accordance with a preferred exemplary embodiment of the invention.

The logic basic cell 400 from FIG. 4 differs from the logic basic cell 100 shown in FIG. 1 by virtue of the fact that the logic selection transistors 108 to 111 and 128 and 129 and, respectively, the logic selection transistors 116 to 119 and 130 and 131 are replaced by hardwired contact-connecting elements, formed from components 403 to 405. The logic basic cell 400 is formed from a first data signal path 401, which contains the first to fourth n-MOS data signal transistors 112 to 115 connected up in a manner similar to that in FIG. 1, and from a second data signal path 402, which contains the CMOS data signal transistors 120 to 123 connected up in a manner similar to that in FIG. 1. The interconnection of the data signal transistors 112 to 115, 120 to 123 in the two data signal paths 401, 402 is fixedly prescribed in terms of hardware, that is to say realized by means of contact-connecting elements of a first metallization plane 403, of a second metallization plane 404 and by means of vias 405, which are formed in a manner running perpendicular to the paper plane of FIG. 4. To put it another way, the logic selection elements of the logic basic cell 400 are provided as invariable hardware elements, namely by means of a plurality of metallization planes 403, 404 and vias 405. The wiring of the data signal transistors 112 to 115 and 120 to 123 defines a respective fixedly prescribed logic function.

To put it another way, in FIG. 4 configuration transistors 108 to 111 and 128 and 129 and, respectively, 116 to 119 and 130 and 131 are replaced by via bridges 403 to 405. Preferably, in each case two vias are used per bridge, as a result of which the conduction load of an open bridge for each transistor is kept as low as possible. Furthermore, four power vias 406 make it possible to isolate possibly omitted logic paths from the supply voltage 127 $V_{DD}$ and from the ground potential $V_{ss}$ 126. The functionality table from FIG. 2 holds true for FIG. 4.

As an alternative, the switches between the individual transistors in FIG. 4 may also be produced by all other via planes, any arbitrary metal layer, polysilicon, diffusion regions or by means of any other suitable plane of a present-day or future CMOS process.

Within the standard CMOS circuitry, the logic basic cell shown in FIG. 4 is a particularly small and fast logic basic cell that is particularly favorable in terms of the power consumption, and therefore constitutes a preferred embodiment.

As in the VPGA realization of the logic basic cell 400 in standard CMOS as shown in FIG. 4, two input inverters 124, 125 are used for generating the negated potentials $\bar{a}_0$, $\bar{a}_1$ from the data signals $a_0$ and $a_1$, respectively.

A description is given below, with reference to FIG. 5, of a logic basic cell 500 in accordance with a fourth exemplary embodiment.

The logic basic cell 500 is provided in a similar manner to the logic basic cell 400 with invariable hardware elements as logic selection elements, i.e. using metallization planes 403, 404 and also vias 405 for connecting data signal transistors in a first data signal path 501 and in a second data signal path 502. In contrast to FIG. 4, the transistors within a respective data signal path 501 or 502 are not all of the same conduction type in FIG. 5.

In the first data signal path 501, compared with FIG. 4, the third n-MOS data signal transistor 114 is replaced by a first p-MOS data signal transistor 503. Furthermore, the fourth n-MOS data signal transistor 115 is replaced by a second p-MOS data signal transistor 504. In the second data signal path 502, the first p-MOS data signal transistor 120 is replaced by a first n-MOS data signal transistor 505, and the second p-MOS data signal transistor 121 is replaced by a second n-MOS data signal transistor 506.

Furthermore, two additional supply potentials 507 and 509 are provided in addition to the supply voltage 127, and two additional ground potentials 508 and 510 are provided in addition to the electrical ground potential 126. The additional supply potential 507 is increased by twice the threshold voltage of the transistors $V_{th}$ compared with the supply potential 127 ($V_{DD}+2V_{th}$); the additional supply potential 509 is increased by just the threshold voltage ($V_{DD}+V_{th}$). The additional ground potential 508 is reduced by twice the threshold voltage $V_{th}$ compared with the ground potential 126 ($V_{SS}-2V_{th}$); the additional supply potential 510 is reduced by just the threshold voltage ($V_{SS}-V_{th}$).

Figure 5:
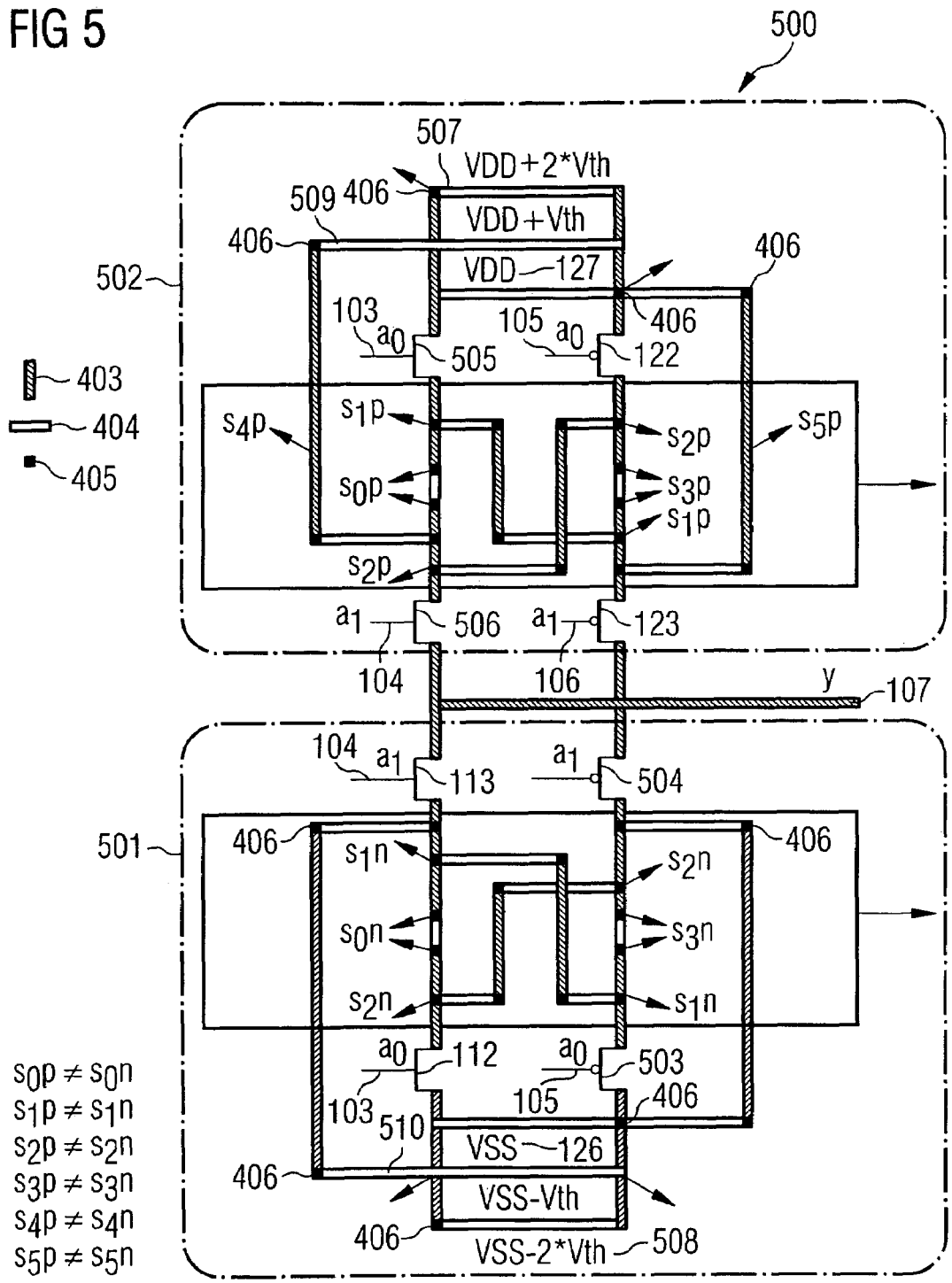
FIG. 5 shows a logic basic cell in accordance with a third exemplary embodiment of the invention.

In the case of the logic basic cell 500 shown in FIG. 5, compared with FIG. 4, the two inverters 124, 125 are obviated on account of the described alteration in the transistor configuration. The n-channel transistors 505, 506 are used for the noninverted input signals $a_0$, $a_1$ in the pull-up path 502, whereas p-channel transistors 503, 504 are used for the inverted input signals $\bar{a}_0$ and $\bar{a}_1$ in the pull-down path 501. The transistors of the n-channel conduction type are incomplete switches for the supply potential 127 $V_{DD}$, and the transistors of the p-channel conduction type for the ground potential 126 $V_{ss}$. In order nevertheless to achieve a full voltage swing at the output y 107, the voltage drops are compensated for by means of raising the supply potential from $V_{DD}$ to ($V_{DD}+V_{th}$) or ($V_{DD}+2V_{th}$) or by means of lowering the ground potential $V_{SS}$ to ($V_{SS}-V_{th}$) or ($V_{ss}-2V_{th}$) using the threshold voltage $V_{th}$.

The logic basic cell 500 provides a logic basic cell having an extremely high combinatorial packing density, two additional supply voltages in each case being provided.

A description is given below, with reference to FIG. 6, of a logic basic cell arrangement 600 in accordance with a preferred exemplary embodiment of the invention.

The logic basic cell arrangement 600 is set up for forming a logic combination of three data signals $a_0$, $a_1$, $a_2$. The logic basic cell arrangement 600 has a first logic basic cell 601 and a second logic basic cell 602, which may be formed like an arbitrary one of the logic basic cells 100, 300, 400, 500 shown in FIG. 1, FIG. 3 to FIG. 5. The first data signal $a_0$ is provided at a first data signal input 603 of the first and second logic basic cells 601, 602. The second data signal $a_1$ is provided at a second data signal input 604 of the first and second logic basic cells 601, 602. On account of the functionality of the first and second logic basic cells 601, 602, a logic combination $f_0(a_1, a_0)$ and $f_1(a_1, a_0)$ is provided at the outputs of the respective logic basic cells 601, 602. The output signal of the first logic basic cell 601 is provided at a first data input 607 of a multiplexer 606. The output signal of the second logic basic cell 602 is provided at a second data signal input 608 of the multiplexer 606. The third data signal 605 $a_2$ is provided at a control input 609 of the multiplexer 606. The output signal $y=f(a_2, a_1, a_0)$, i.e. the logic combination of the three data signals $a_0$, $a_1$ and $a_2$, is provided at the data signal output 610 of the multiplexer 606.

The functionality of the multiplexer 606 can be described on the basis of equation (1).

Figure 6:
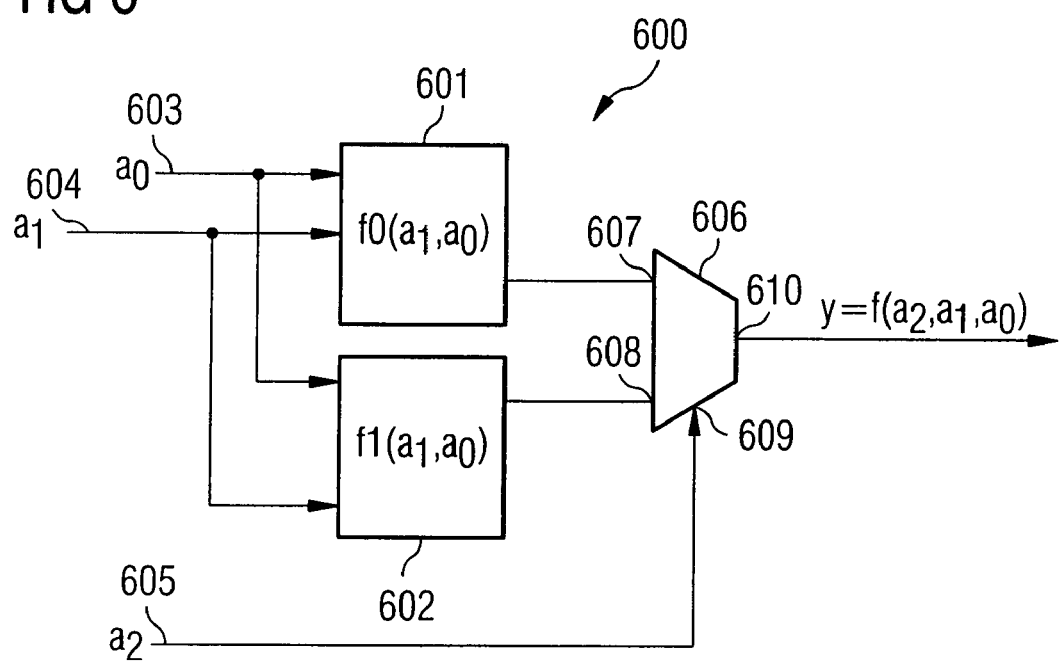
FIG. 6 shows a logic basic cell in accordance with a fourth exemplary embodiment of the invention.

Consequently, FIG. 6 shows a logic basic cell arrangement 600 which can realize a function of three data signals using two logic basic cells according to the invention. By means of interconnecting a plurality of such logic basic cell arrangements to form a logic device, it is possible to realize an arbitrary logic combination of more than three data signals.

A description is given below, with reference to FIG. 7, of a logic basic cell 700 in accordance with a fifth exemplary embodiment of the invention.

The logic basic cell 700 from FIG. 7 differs from the logic basic cell 100 shown in FIG. 1 in particular in the interconnection of the fifth n-MOS logic selection transistor 128 and of the fifth p-MOS logic selection transistor 130.

The first source/drain terminal of the fifth n-MOS logic selection transistor 128 is coupled to the first source/drain terminal of the fifth p-MOS logic selection transistor 130 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107. Correspondingly, the first source/drain terminal of the fifth p-MOS logic selection transistor 130 is coupled to the first source/drain terminal of the fifth n-MOS logic selection transistor 128 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107.

Furthermore, the second source/drain terminal of the fifth n-MOS logic selection transistor 128 is not coupled directly to the supply potential 126 as in the case of the logic basic cell 100 in accordance with FIG. 1, but rather to the first source/drain terminal of the first n-MOS data signal transistor 112. In accordance with the antisymmetrical arrangement, the second source/drain terminal of the fifth p-MOS logic selection transistor 130 is not coupled directly to the supply potential 127, but rather to the first source/drain terminal of the first p-MOS data signal transistor 120.

A description is given below, with reference to FIG. 8, of a logic basic cell 800 in accordance with a sixth exemplary embodiment of the invention.

The logic basic cell 800 from FIG. 8 differs from the logic basic cell 100 shown in FIG. 1 in particular in the interconnection of the sixth n-MOS logic selection transistor 129 and of the sixth p-MOS logic selection transistor 131.

The first source/drain terminal of the sixth n-MOS logic selection transistor 129 is coupled to the first source/drain terminal of the sixth p-MOS logic selection transistor 131 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107. Correspondingly, the first source/drain terminal of the sixth p-MOS logic selection transistor 131 is coupled to the first source/drain terminal of the sixth n-MOS logic selection transistor 129 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107.

Furthermore, the second source/drain terminal of the sixth n-MOS logic selection transistor 129 is not coupled directly to the supply potential 126, but rather to the second source/drain terminal of the third n-MOS data signal transistor 114. In accordance with the antisymmetrical arrangement, the second source/drain terminal of the sixth p-MOS logic selection transistor 131 is not coupled directly to the supply potential 127, but rather to the second source/drain terminal of the third p-MOS data signal transistor 122.

A description is given below, with reference to FIG. 9, of a logic basic cell 900 in accordance with a seventh exemplary embodiment of the invention.

The logic basic cell 800 from FIG. 8 differs from the logic basic cell 100 shown in FIG. 1 in particular in the interconnection of the fifth n-MOS logic selection transistor 128, of the fifth p-MOS logic selection transistor 130, of the sixth n-MOS logic selection transistor 129 and of the sixth p-MOS logic selection transistor 131.

Clearly, the seventh exemplary embodiment corresponds, with regard to the change, to a combination of the changes of the fifth exemplary embodiment and of the sixth exemplary embodiment in comparison with the logic basic cell 100.

To put it another way, this means that the first source/drain terminal of the fifth n-MOS logic selection transistor 128 is coupled to the first source/drain terminal of the fifth p-MOS logic selection transistor 130 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107. Correspondingly, the first source/drain terminal of the fifth p-MOS logic selection transistor 130 is coupled to the first source/drain terminal of the fifth n-MOS logic selection transistor 128 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107.

Furthermore, the second source/drain terminal of the fifth n-MOS logic selection transistor 128 is not coupled directly to the supply potential 126, but rather to the first source/drain terminal of the first n-MOS data signal transistor 112. In accordance with the antisymmetrical arrangement, the second source/drain terminal of the fifth p-MOS logic selection transistor 130 is not coupled directly to the supply potential 127, but rather to the first source/drain terminal of the first p-MOS data signal transistor 120.

Furthermore, the first source/drain terminal of the sixth n-MOS logic selection transistor 129 is coupled to the first source/drain terminal of the sixth p-MOS logic selection transistor 131 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107. Correspondingly, the first source/drain terminal of the sixth p-MOS logic selection transistor 131 is coupled to the first source/drain terminal of the sixth n-MOS logic selection transistor 129 and also to the second source/drain terminal of the second n-MOS data signal transistor 113, the second source/drain terminal of the second p-MOS data signal transistor 121, the first source/drain terminal of the fourth n-MOS data signal transistor 115, the first source/drain terminal of the fourth p-MOS data signal transistor 123 and to the data signal output 107.

Furthermore, the second source/drain terminal of the sixth n-MOS logic selection transistor 129 is not coupled directly to the supply potential 126, but rather to the second source/drain terminal of the third n-MOS data signal transistor 114. In accordance with the antisymmetrical arrangement, the second source/drain terminal of the sixth p-MOS logic selection transistor 131 is not coupled directly to the supply potential 127, but rather to the second source/drain terminal of the third p-MOS data signal transistor 122.

It should be noted that the logic basic cells 700, 800 and 900 constitute outlay-identical, symmetrical realizations of the same functionality which the logic basic cell 100 provides. Their respective functionality table is to be adapted in accordance with their respective interconnection in comparison with the functionality table 200 from FIG. 2.

It should furthermore be pointed out that, in the event of relinquishing symmetry, a further 12, that is to say a total of 16 switch combinations of the fifth n-MOS logic selection transistor 128, of the fifth p-MOS logic selection transistor 130, of the sixth n-MOS logic selection transistor 129 and of the sixth p-MOS logic selection transistor 131 are provided in alternative embodiments of the invention, which likewise provide all logic combinations of 2 input signals in a switchable manner.

The same applies correspondingly to the embodiments illustrated in FIG. 3, FIG. 4 and FIG. 5, in which case it should be pointed out that four alternative embodiments are provided in the case of the embodiment in accordance with FIG. 3.

The invention claimed is:

1. A logic basic cell for forming a logic combination of two data signals in accordance with a logic function that can be selected by means of a plurality of logic selection elements, comprising:
   a first logic selection element, set in accordance with a first switching variable, between a first data signal input and a second data signal input;
   a second logic selection element, set in accordance with a second switching variable, between the first data signal input and a fourth data signal input;
   a third logic selection element, set in accordance with a third switching variable, between the second data signal input and a third data signal input;
   a fourth logic selection element, set in accordance with a fourth switching variable, between the third data signal input and the fourth data signal input;
   a fifth logic selection element, set in accordance with a fifth switching variable, between a reference potential and the second data signal input or between the first data signal input and the data signal output;
   a sixth logic selection element, set in accordance with a sixth switching variable, between a reference potential and the fourth data signal input or between the third data signal input and the data signal output; and
   a data signal output, at which the logic combination of the two data signals in accordance with the logic function selected by means of the logic selection elements can be provided as an output signal,
   wherein the first, second, third, and fourth data signal inputs have two data signals and logically complementary data signals thereof applied thereto, and
   wherein which case all possible logic functions for combination of the two data signals can be set by setting the six switching variables.

2. The logic basic cell as claimed in claim 1, wherein the logic selection elements are invariable hardware elements.

3. The logic basic cell as claimed in claim 1, wherein the logic selection elements are realized by means of a plurality of metallization planes and/or by means of vias.

4. The logic basic cell as claimed in claim 1, wherein
   the first logic selection element is a first logic transistor, which can be controlled by means of a first logic selection signal;
   the second logic selection element is a second logic transistor, which can be controlled by means of a second logic selection signal;
   the third logic selection element is a third logic transistor, which can be controlled by means of a third logic selection signal;
   the fourth logic selection element is a fourth logic transistor, which can be controlled by means of a fourth logic selection signal;
   the fifth logic selection element is a fifth logic transistor, which can be controlled by means of a fifth logic selection signal; and
   the sixth logic selection element is a sixth logic transistor, which can be controlled by means of a sixth logic selection signal.

5. The logic basic cell as claimed in claim 4, further comprising first, second, third, and fourth data signal transistors, at the gate terminals of which in each case one of the data signals or the logically complementary data signal with respect to one of the data signals can be provided.

6. The logic basic cell as claimed in claim 5, wherein the first data signal transistor is connected such that its
   first source/drain terminal is coupled to a first source/drain terminal of the first logic transistor and to a first source/drain terminal of the second logic transistor; and
   second source/drain terminal is coupled to a first source/drain terminal of a third data signal transistor.

7. The logic basic cell as claimed in claim 6, wherein the third data signal transistor is connected such that its second source/drain terminal is coupled to a first source/drain terminal of the fourth logic transistor and to a first source/drain terminal of the third logic transistor.

8. The logic basic cell as claimed in claim 5, wherein the second data signal transistor is connected such that its
   first source/drain terminal is coupled to a second source/drain terminal of the first logic transistor and to a second source/drain terminal of the third logic transistor; and
   second source/drain terminal is coupled to a first source/drain terminal of a fourth data signal transistor.

9. The logic basic cell as claimed in claim 8, wherein the fourth data signal transistor is connected such that its second source/drain terminal is coupled to a second source/drain terminal of the second logic transistor and to a second source/drain terminal of the fourth logic transistor.

10. The logic basic cell as claimed in claim 5, wherein the fifth logic transistor is connected such that its
    first source/drain terminal is connected to the first source/drain terminal of the second data signal transistor, the second source/drain terminal of the first logic transistor and the second source/drain terminal of the third logic transistor; and
    second source/drain terminal is connected to the second source/drain terminal of the first data signal transistor and the first source/drain terminal of the third data signal transistor.

11. The logic basic cell as claimed in claim 9, wherein the fifth logic transistor is connected such that its
    first source/drain terminal is connected to the second source/drain terminal of the second data signal transistor and the first source/drain terminal of the fourth data signal transistor; and
    second source/drain terminal is connected to the first source/drain terminal of the first data signal transistor, the first source/drain terminal of the first logic transistor and the first source/drain terminal of the second logic transistor.

12. The logic basic cell as claimed in claim 11, wherein the fifth logic transistor is further connected such that its second source/drain terminal is connected to a supply potential.

13. The logic basic cell as claimed in claim 10, wherein the sixth logic transistor is connected such that its
    first source/drain terminal is connected to the second source/drain terminal of the fourth data signal transistor, the second source/drain terminal of the second logic transistor and the second source/drain terminal of the fourth logic transistor, and
    second source/drain terminal is connected to the second source/drain terminal of the first data signal transistor and the first source/drain terminal of the third data signal transistor.

14. The logic basic cell as claimed in claim 13, wherein the sixth logic transistor is further connected such that its second source/drain terminal is connected to a supply potential.

15. The logic basic cell as claimed in claim 10, wherein the sixth logic transistor is connected such that its
    first source/drain terminal is connected to the second source/drain terminal of the second data signal transistor and to the first source/drain terminal of the fourth data signal transistor; and
    second source/drain terminal is connected to the second source/drain terminal of the third data signal transistor, the first source/drain terminal of the third logic transistor and the first source/drain terminal of the fourth logic transistor.

16. The logic basic cell as claimed in claim 1, further comprising an evaluation switch coupled to the data signal output and having a precharge switch, wherein the switches are connected and can be controlled such that the output signal is provided at an output of the logic basic cell when the evaluation switch is closed and the precharge switch is open, and a reference signal is provided at the output of the logic basic cell when the precharge switch is closed and the evaluation switch is open.

17. The logic basic cell as claimed in claim 16, wherein each of the evaluation switch and the precharge switch is a transistor.

18. The logic basic cell as claimed in claim 5, wherein each of the logic transistors and each of the data signal transistors is a transistor of a first conduction type, and the transistors of the first conduction type form a first data signal path, and
further comprising a second data signal path formed from transistors of a second conduction type, which is complementary to the first conduction type, wherein for each of the transistors of the first data signal path, a correspondingly connected transistor is provided in the second data signal path.

19. The logic basic cell as claimed in claim 18, wherein
the first conduction type is the p conduction type and the second conduction type is the n conduction type; or
the first conduction type is the n conduction type and the second conduction type is the p conduction type.

20. The logic basic cell as claimed in claim 1, set up as a CMOS logic basic cell.

21. The logic basic cell as claimed in claim 1, further comprising:
a first inverter for forming a logically complementary first data signal with respect to a first data signal; and
a second inverter for forming a logically complementary second data signal with respect to a second data signal.

22. The logic basic cell as claimed in claim 5, wherein two of the data signal transistors are transistors of a first conduction type and two of the data signal transistors are transistors of a second conduction type, which is complementary to the first conduction type, and the four data signal transistors form a first data signal path, and
further comprising a second data signal path formed from transistors, wherein for each of the transistors of the first data signal path has a correspondingly connected transistor provided in the second data signal path, corresponding transistors of the first and of the second data signal paths being transistors of the same conduction type.

23. The logic basic cell as claimed in claim 22, wherein the transistors of a respective data signal path are provided with electrical supply potentials such that different threshold voltages of transistors of the first and of the second conduction type are at least partly compensated for.

24. The logic basic cell as claimed in claim 1, set up as an application specific integrated circuit.

25. The logic basic cell as claimed in claim 1, set up as a programmable logic device, a field programmable gate array, or a mask programmed application specific integrated circuit.

26. A logic basic cell arrangement for forming a logic combination of three data signals, comprising:
a first logic basic cell and a second logic basic cell as claimed in claim 1, to the data signal inputs of which the three data signals and logically complementary data signals of the three data signals can be applied; and
a multiplexer having a first data input at which the output signal of the first logic basic cell is provided, a second data input at which the output signal of the second logic basic cell is provided, a control input at which the third data signal is provided, and a data signal output at which the logic combination of the three data signals is provided as output signal.

27. A logic device for forming a logic combination of more than three data signals, having a plurality of logic basic cell arrangements as claimed in claim 26.

28. A logic basic cell for forming a logic combination of two data signals in accordance with a logic function, comprising:
four data signal inputs, to which the two data signals and logically complementary data signals thereof are applied;
six logic selection elements, which are connected between the data signal inputs, for selecting the logic function; and
a data signal output,
wherein a logic combination of the two data signals in accordance with the logic function selected by means of the logic selection elements is provided as an output signal on the data signal output.

29. The logic basic cell of claim 28, wherein the six logic selection elements are set in accordance with respective switching variables, and all possible logic functions for the logic combination of the two data signals can be obtained by setting the six switching variables.

30. A logic basic cell arrangement for forming a logic combination of three data signals, comprising:
a first logic basic cell and a second logic basic cell as claimed in claim 28, to the data signal inputs of which the three data signals and logically complementary data signals of the three data signals can be applied; and
a multiplexer having a first data input at which the output signal of the first logic basic cell is provided, a second data input at which the output signal of the second logic basic cell is provided, a control input at which the third data signal is provided, and a data signal output at which the logic combination of the three data signals is provided as output signal.

31. A logic device for forming a logic combination of more than three data signals, having a plurality of logic basic cell arrangements as claimed in claim 30.

32. A logic basic cell for forming a logic combination of two data signals in accordance with a logic function, comprising:
data signal inputs, to which the two data signals and logically complementary data signals thereof are applied;
six logic selection means, which are connected between the data signal inputs, for selecting the logic function; and
a data signal output,
wherein a logic combination of the two data signals in accordance with the logic function selected by means of the logic selection means is provided as an output signal on the data signal output.

* * * * *

UNITED STATES PATENT AND TRADEMARK OFFICE
CERTIFICATE OF CORRECTION

PATENT NO. : 7,279,936 B2
APPLICATION NO. : 11/007650
DATED : October 9, 2007
INVENTOR(S) : Jorg Glieese et al.

It is certified that error appears in the above-identified patent and that said Letters Patent is hereby corrected as shown below:

At column 12, line 37, "$s_1 \neq s_1n;$" should read --$s_1p \neq s_1n$--

At column 12, line 52, "sop" should read --$s_0p$--

At column 13, line 6, "sop" should read --$s_0p$--

At column 13, line 21, "sop" should read --$s_0p$--

At column 13, line 23, "sip" should read --$s_1p$--

Signed and Sealed this

First Day of January, 2008

JON W. DUDAS
*Director of the United States Patent and Trademark Office*